Figure 1A:
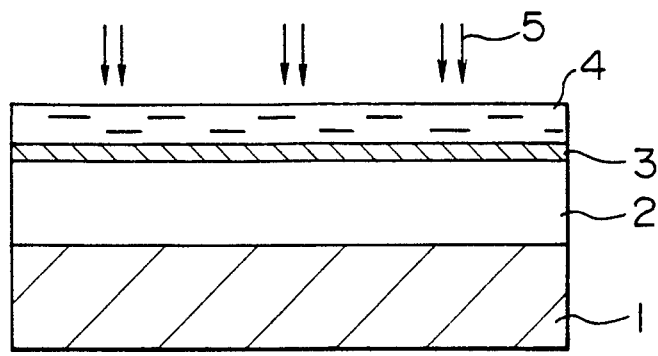

United States Patent [19]
Hashimoto et al.

[11] Patent Number: 5,169,494
[45] Date of Patent: Dec. 8, 1992

[54] FINE PATTERN FORMING METHOD
[75] Inventors: Kazuhiko Hashimoto, Moriguchi; Taichi Koizumi, Osaka; Kenji Kawakita, Neyagawa; Noboru Nomura, Kyoto, all of Japan
[73] Assignee: Matsushita Electric Industrial Co., Ltd., Osaka, Japan
[21] Appl. No.: 742,550
[22] Filed: Aug. 8, 1991

Related U.S. Application Data
[63] Continuation of Ser. No. 496,025, Mar. 20, 1990, abandoned.

[30] Foreign Application Priority Data
Mar. 27, 1989 [JP] Japan ............................ 1-75319
[51] Int. Cl.⁵ .................................................. G03C 5/16
[52] U.S. Cl. ............................ 156/661.1; 156/659.1; 156/665; 156/904; 430/18; 430/270; 430/313; 430/325; 430/326
[58] Field of Search ...................... 156/668, 661.1, 655, 156/659.1, 904; 430/326, 325, 313, 312, 316, 15, 18

[56] References Cited
U.S. PATENT DOCUMENTS

| | | | |
|---|---|---|---|
| 4,589,952 | 5/1986 | Behringer et al. | 156/661.1 X |
| 4,657,832 | 4/1987 | Pfeifer | 430/325 X |
| 4,683,024 | 7/1987 | Miller et al. | 156/661.1 X |
| 4,747,909 | 5/1988 | Kanazawa et al. | 156/661.1 X |
| 4,790,903 | 12/1988 | Sugano et al. | 156/661.1 X |
| 4,826,564 | 5/1989 | Desilets et al. | 156/661.1 X |
| 4,936,951 | 6/1990 | Hashimoto et al. | 156/611.1 X |

OTHER PUBLICATIONS
Jackel et al., "50-nm Silicon Structures . . . Reactive-Ion Etching"; Appl. Phys. Lett. 39(3), Aug. 1981, pp. 268-270.
Patent Abstracts of Japan, unexamined applications, E section, vol. 2, No. 115, Sep. 25, 1978, The Patent Office Japanese Government, p. 6534 E 78 Kokai-No. 53-81 079 (Fujitsu).
Chemical Abstracts, vol. 110, No. 12, Mar. 20, 1989, Columbus, Ohio, USA, Nagamatsu, Keiji et al. "Insulation substrates for printed wiring boards," p. 784, col. 1, Abstract No. 106 602c & Jpn, Kokai Tokkyo Koho JP 63,250,188 (88,250,188).
Chemical Abstracts, vol. 104, No. 8, Feb. 24, 1986, Columbus, Ohio, USA, Fujitsu Ltd. "negative resist composition.", p. 568, col. 2, Abstract No. 59 418m & Jpn. Kokai Tokkyo Koho JP 60,177,241 (85,177,241).
Patent Abstracts of Japan, unexamined applications, E section, vol. 14, No. 130, Mar. 12, 1990 The Patent Office Japanese Government p. 125 E 901 Kokai-No. 1-321 687 (Toyo Metaraijingu).
Patent Abstracts of Japan, unexamined applications, E section, vol. 13, No. 321, Jul. 20, 1989 The Patent Office Japanese Government p. 90 #790 Kokai-No. 1-89 389 (Sumitomo).
Patent Abstracts of Japan, unexamined applications, P section, vol. 14, No. 101, Feb. 23, 1990 The Patent Office Japanese Government p. 5 P 1012 Kokai-No. 1-304 (Fujitsu).

*Primary Examiner*—Thi Dang
*Attorney, Agent, or Firm*—Stevens, Davis, Miller & Mosher

[57] ABSTRACT

The present invention provides a method of forming a fine pattern comprising the steps of forming on a semiconductor substrate an organic polymer film and heat treating it, forming on the organic polymer film an inorganic film and heat treating it, forming on the inorganic film an electron beam resist film and heat treating it, drawing a pattern on the resist film, developing it to form a resist pattern, and etching the inorganic film and the organic polymer film using the resist pattern as a mask, wherein the improvement comprises using one substance selected from the group consisting of a polyphenylene sulfide, a derivative thereof, and a polymer represented by the formula (I):

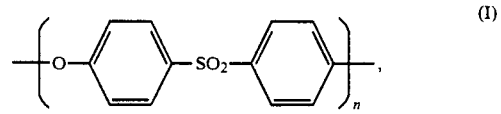

(I)

where n is a positive integer, for forming at least one of the organic polymer film and the electron beam resist film. According to the present invention, it is possible to prevent charging by incident electrons, thereby keeping free of field butting and reduction of overlay accuracy, and to form an accurate and vertical fine resist pattern.

11 Claims, 5 Drawing Sheets

FINE PATTERN FORMING METHOD

This application is a continuation of application Ser. No. 07/496,025, filed Mar. 20, 1990, now abandoned.

This invention relates to a method of forming a fine pattern. The method of the present invention can be utilized when fabricating semiconductor devices or integrated circuits by forming a pattern using electron beams.

Hitherto, in the fabrication of IC's and LSI's, patterns have been formed according to photolithographic techniques using ultraviolet rays. With the advance of miniaturization of devices, attempts are being made of enhancement of NA of stepper lens, use of a short wavelength light source and development of other techniques. The measures mentioned above, however, involve the problem to cause a decrease of focus depth.

Electron beam lithography has been developed and is making its way into popular use for forming a fine pattern of LSI devices and production of ASIC's. Use of a positive type electron beam resist is essential when forming a fine pattern according to the electron beam lithography. Among known materials used for composing said resist, polymethyl methacrylate (PMMA) is the best in resolving performance, but this compound is low in sensitivity. Many reports have been published in recent years on improvement of sensitivity of positive type electron beam resist For instance, proposal has been made of use of such materials as polybutyl methacrylate, a copolymer of methyl methacrylate and methacrylic acid, a copolymer of methacrylic acid and acrylonitrile, a copolymer of methyl methacrylate and isobutylene, polytubene-1-sulfone, polyisopropenyl ketone, and fluoro polymethacrylate for composing positive type electron beam resists For increasing sensitivity, any of these proposed resist materials has an electron withdrawing group as a side chain and easily degradable bond in the principal chain so that scission of the principal chain may be readily effected by electron beam irradiation. But these resist materials are incapable of satisfying both requirements for high resolution and high sensitivity.

Employment of electron beam lithography for forming fine patterns also has the problems such as low dry etch resistance of the electron beam resist, influence on pattern precision by proximity effect due to forward scattering and back scattering of electrons, and influence on pattern drawing due to charging by electrons applied in exposure.

Figure 5A:
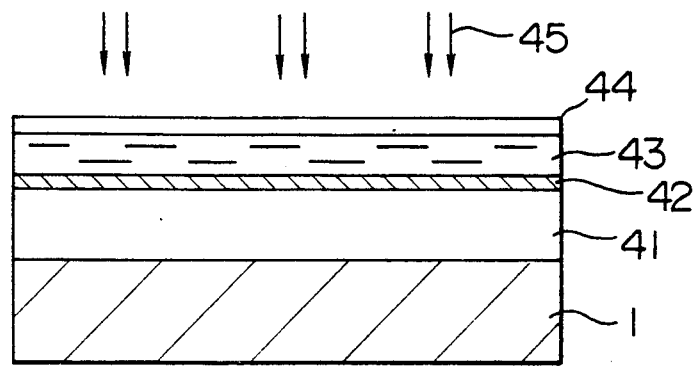
Figure 5B:
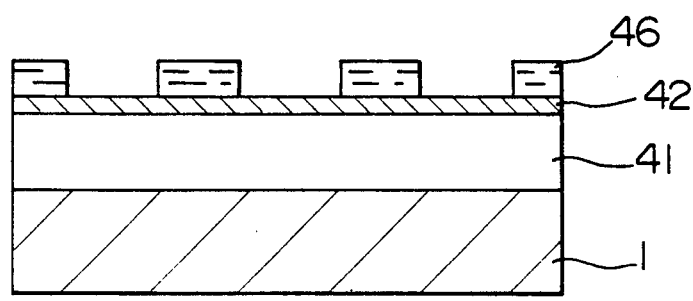
Figure 5C:
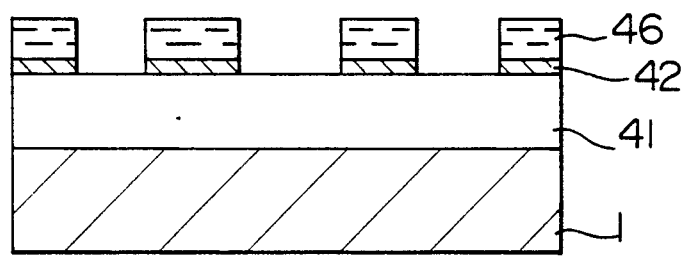
Figure 5D:
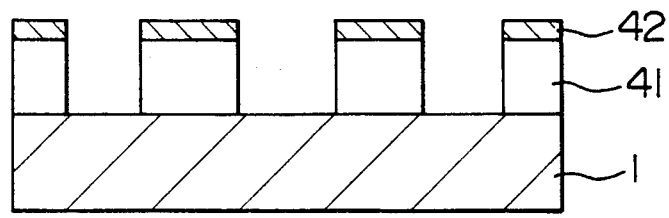

A multi-layer resist process in which the function of resist is shared by a pattern forming layer and a planarizing layer is a very effective method for solving or alleviating said problems. FIG. 5A–FIG. 5D illustrate a conventional multi-layer resist process in electron beam lithography. According to this process, an organic polymer film is applied on a semiconductor substrate 1 to a thickness of 2 to 3 μm to form a bottom layer 41 which serves for suppressing the proximity effect, and then an inorganic film such as $SiO_2$ film or SOG (spin on glass) film is applied on said bottom layer 41 to a thickness of 0.2 μm to form an intermediate layer 42. On this intermediate layer 42 is further applied a 0.5 μm thick electron beam resist forming an top layer 43, and an aluminum film 44 is deposited thereon to a thickness of about 100 Å for preventing the charging (FIG. 5A). After exposure to electron beams 45, aluminum film 44 is dissolved away with an alkaline solution and then development is performed to form a resist pattern 46 (FIG. 5B). Thereafter, intermediate layer 42 is dry etched by using said resist pattern 46 as a mask (FIG. 5C), followed by additional dry etching of bottom layer 41 with the residual intermediate layer 42 serving as a mask (FIG. 5D). Use of the above multi-layer resist process makes it possible to form a fine pattern at a high aspect ratio.

As described above, the multi-layer resist process using an aluminum film is an effective method for forming a fine pattern, but this process still involves the problems such as complex process and possible contamination with aluminum. Also, the multi-layer resist process using no aluminum film has the problem of charging.

The term "charging" referred to in the present invention means the phenomenon that the incident electrons are accumulated in the insulator resist, intermediate layer or bottom layer In electron beam lithography, this charging phenomenon gives rise to serious problems such as field butting and lowering of overlay accuracy Such a charging phenomenon is also seen in the single-layer resist process and causes the same problems as in the case of the above three-layer resist process.

This charging phenomenon can be accounted for by the fact that in electron beam lithography, incident electrons are scattered in the resist but unable to penetrate further than the depth of 1 to 1.5 μm from the resist surface, causing accumulation of charges in this region, and the accumulated charges refract the incident electron beams to cause troubles such as field butting and reduction of overlay accuracy.

In order to solve these problems, the present inventors have pursued studies eagerly on conducting electron beam resists and process for forming fine patterns by using such resists, and as a result, have succeeded in achieving the present invention.

The present invention relates to a method of forming a fine pattern comprising the steps of forming on a semiconductor substrate an organic polymer film and heat treating it, forming on the organic polymer film an inorganic film and heat treating it, forming on the inorganic film an electron beam resist film and heat treating it, drawing a pattern on the resist film, developing it to form a resist pattern, and etching the inorganic film and the organic polymer film using the resist pattern as a mask, wherein the improvement comprises using one substance selected from the group consisting of a polyphenylene sulfide, a derivative thereof and a polymer represented by the formula (I):

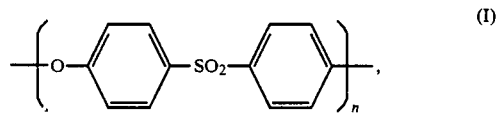

where n is a positive integer, for forming at least one of the organic polymer film and the electron beam resist film.

An object of the present invention is to provide a pattern forming process which is capable of forming a correct and fine resist pattern while preventing charging by electrons or electric charged particles when conducting direct pattern drawing with electric charged beams such as electron beams or focused ion beams using a multi-layer resist.

A method of forming a fine pattern of the present invention is capable of eliminating the risk of inducing pattern distortion due to the charging at the time of drawing by using a poly(phenylene sulfide) type conducting polymer material or the like and makes it possible to form a desired accurate and fine resist pattern, thus greatly contributing to the fabrication of ultra-high-density integrated circuits Other objects and advantages of the present invention will become apparent by the following description and attached drawings.

In the attached drawings, FIGS. 1A to 4D are sectional views illustrating schematically pattern forming processes in the embodiments of the present invention.

FIG. 5A-FIG. 5D show in sectional view a conventional multi-layer resist process Polyphenylene sulfides and derivatives thereof (these compounds may hereinafter be referred to generically as PPS) used in the present invention include, as typical examples thereof, poly-p-phenylene sulfide and derivatives thereof represented by the formula (II):

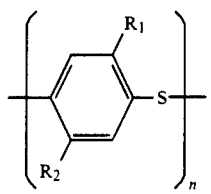
(II)

where $R_1$ and $R_2$ independently represent hydrogen or an alkyl group, and n represents a positive integer, and poly-m-phenylene sulfide and derivatives thereof represented by the formula (III):

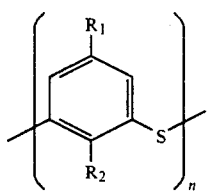
(III)

where $R_1$ and $R_2$ independently represent hydrogen or an alkyl group, and n represents a positive integer. These polymers are conducting polymers and used for forming one of electron beam resists used in the multi-layer resist process in accordance with the present invention.

PPS have C—S bonds susceptible to degradation by electron beams in the principal chain and can therefore provide a positive type resist showing a high sensitivity to electron beams. As PPS also has stable benzene rings capable of forming a resonance structure in the principal chain, it shows high dry etch resistance.

In the present invention, polymers represented by the formula (I):

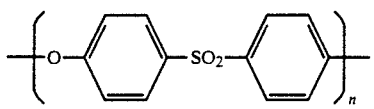
(I)

where n is a positive integer (these polymers may hereinafter be referred to as PPSO) are also used for forming another electron beam resist used in the multi-layer resist process. PPSO is also a conducting polymer.

PPSO has in the principal chain C—S bonds susceptible to degradation by electron beams and is reduced in molecular weight by way of the following reaction:

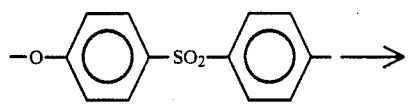

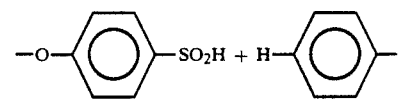

Also, as PPSO has benzene rings in the principal chain, it shows high dry etch resistance and can form a high-sensitivity positive type resist.

In the formulae (I), (II) and (III) shown above, the alkyl group represented by $R_1$ or $R_2$ is the one having preferably 1 to 15, more preferably 1 to 10, even more preferably 1 to 5 carbon atoms. The above polymers represented by the formulae (I), (II) and (III) have a molecular weight in a range of from 100,000 to hundreds of thousands, preferably from 100,000 to 300,000.

Both of PPS and PPSO, when doped with ions, can be made into conducting polymers showing higher conductivity. Especially, when poly-p-phenylene sulfide is doped with ions, there takes place a crosslinking reaction such as shown below, and it is considered that the resulting crosslinked structure contributes to the occurrence of high conductivity:

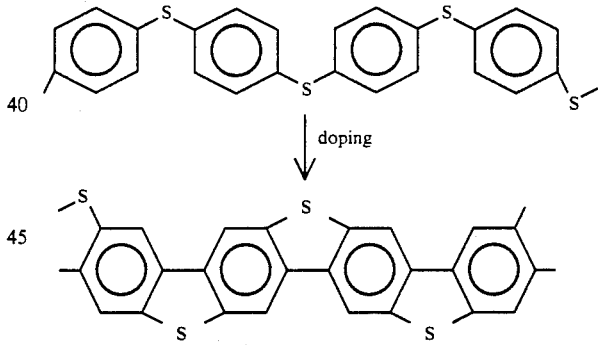

As ions employed for doping in the present invention, there can be used ions of iodine, arsenic pentafluoride and the like. The above conducting polymers can be used for forming either top layer or bottom layer of the multi-layer resist In the former case, the conducting polymer used functions as a conducting electron beam resist to prevent the charging of the whole resist. In the latter case, since the bottom layer has conductivity, it is possible to prevent the charging of the whole resist even when a conventional insulating electron beam resist is used as the top layer.

In either case, it is possible to form an accurate and fine pattern free of butting error or misalignment due to the charging with no need of providing an aluminum film at the time of direct pattern drawing by application of electron beams.

A method of forming a fine pattern of the present invention is described below.

First, an organic polymer film is formed as the bottom layer on a semiconductor substrate. The polymers usable for forming said organic polymer film include polyphenylene sulfides represented by the above formulae (II) and (III) (PPS), polymers represented by the above formula (I) (PPSO) and polymer which have been heretofore used in forming three-layer resists such as polymethyl methacrylate (PMMA) and the like. However, in case of using an insulating polymer such as PMMA, it is necessary to use a conducting polymer such as mentioned above for forming the top layer which is described later. In case of using PPS or PPSO, they may be doped with ions, if necessary.

Then the organic polymer film is subjected to a heat treatment. This heat treatment is conducted at 150° to 200° C. for 20 to 30 minutes.

An inorganic film is then formed on said organic polymer film and subjected to a heat treatment described above The inorganic materials usable for forming said inorganic film include $SiO_2$, SOG and other types of inorganic material which are usually used for forming three-layer resists.

Then an electron beam resist is applied on said inorganic film and subjected to a heat treatment as described above. This electron beam resist may be made of the above-mentioned PPS, PPSO or a conventional electron beam resist such as PMMA or the like. However, in case of using an insulating electron beam resist such as PMMA, it is necessary to use PPS or PPSO for forming the bottom layer. In contrast, in case of using an insulating polymer such as PMMA for forming the bottom layer, PPS or PPSO must be used as an electron beam resist material.

Then a pattern is drawn on the obtained resist film and developed to form a resist pattern As developers, there can be used methyl isobutyl ketone (MIBK), isopropyl alcohol (IPA), a mixture thereof, organic alkali solutions, polar solvents and the like.

Finally, both inorganic film and organic polymer film are etched by using said resist pattern as a mask to obtain a desired fine pattern.

Hereinafter, the present invention is described more particularly with reference to Examples and Referential Examples. However, the present invention should not be construed to be restricted by the Examples.

REFERENTIAL EXAMPLE 1

0.1 g of poly(p-phenylene sulfide) having a molecular weight of about 100,000 was dissolved in 10 ml of $AsF_3$, and then the insolubles were filtered out to prepare a resist solution. This resist solution was applied dropwise onto a semiconductor substrate for spin coating at 2,000 r.p.m. and then baked at 150° C. for 30 minutes to obtain a resist film having a thickness of 1.2 μm. The resist film was subjected to electron beam irradiation at an accelerating voltage of 20 kV and a dose of 10 μC/cm² and then developed with a mixed solution of methyl isobutyl ketone (MIBK) and isopropyl alcohol (IPA). There could consequently be obtained an accurate positive type resist pattern free of field butting error due to charging. There was seen little decrease of film in the non-irradiated portion. A good resist pattern could be also obtained when using a polar solvent other than MIBK as a developer component in the above process.

REFERENTIAL EXAMPLE 2

0.1 g of poly(m-phenylene sulfide) having a molecular weight of about 100,000 was applied onto a semiconductor substrate and baked at 150° C. for 20 minutes to form a 1.2 μm thick resist film. This resist film was doped with arsenic pentafluoride, then subjected to electron beam irradiation at an accelerating voltage of 20 kV and a dose of 10 μC/cm² and developed with a mixed solution of MIBK and IPA. There could resultantly be obtained an accurate positive type resist pattern free of field butting error due to charging. The obtained resist was capable of etching of the substrate because of its high dry etch resistance. A good resist pattern could be also obtained when using a polar solvent other than MIBK as a developer component in the above process.

REFERENTIAL EXAMPLE 3

0.5 g of PPSO having a molecular weight of about 100,000 and represented by the following formula:

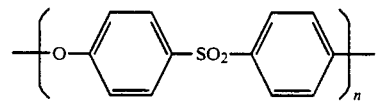

was dissolved in 50 ml of ethyl cellosolve acetate and then the insolubles were filtered out to prepare a resist solution. This resist solution was applied dropwise onto a semiconductor substrate for spin coating at 2,000 r.p.m. and then baked at 150° C. for 20 minutes to form a 1.2 μm thick resist film. This resist film was doped with iodine ions, then exposed to electron beams at an accelerating voltage of 20 kV and a dose of 10 μC/cm² and developed with an organic alkaline solution. There could thereby be obtained a correct positive type resist pattern free of field butting error due to charging. There was seen little decrease of film in the non-exposed portion The obtained resist was capable of etching of the substrate because of its high dry etch resistance. It was also possible to obtain a negative type resist pattern by using a polar solvent as a developer component in the above process.

EXAMPLE 1

This example is explained with reference to FIG. 1A–FIG. 1D.

Figure 1B:
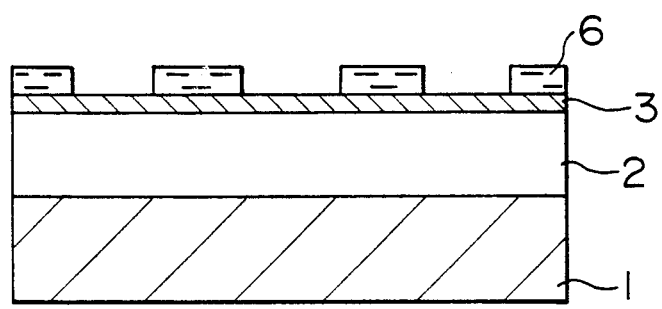
Figure 1C:
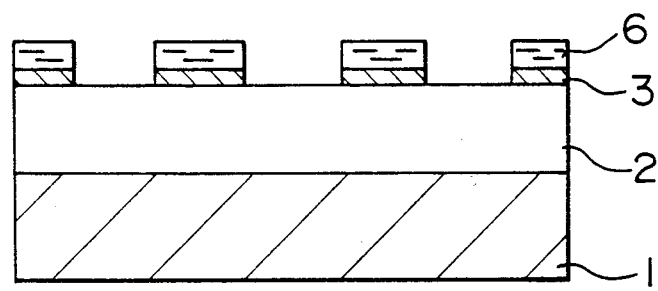
Figure 1D:
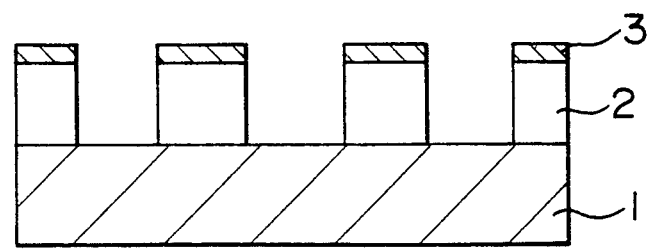

A novolak resin was applied on a semiconductor substrate 1 to a thickness of 2 μm and the resin was baked at 220° C. for 20 minutes to form a bottom layer 2. SOG (spin on glass) was applied on said bottom layer 2 to a thickness of 0.2 μm and baked at 200° C. for 20 minutes to form an intermediate layer 3. On this intermediate layer was formed a film of poly-p-phenylene sulfide used in Referential Example 1 to form an electron beam resist 4, and this resist film was baked at 150° C. for 20 minutes to obtain a resist film having a thickness of 0.5 μm (FIG. 1A). This resist film was exposed to electron beams 5 at an accelerating voltage of 20 kV and a dose of 5 μC/cm² and developed with a mixed solution of MIBK and IPA, whereby there was obtained an accurate and fine resist pattern 6 (FIG. 1B). Owing to high conductivity of the resist, there was seen no trace of field butting error due to charging. Then the SOG intermediate layer 3 was etched by using said resist pattern as a mask (FIG. 1C), and this was followed by etching of the lower layer 2 by using said intermediate layer as a mask, which gave an accurate and fine resist pattern (FIG. 1D). A similar result could be obtained when using the polymers obtained in Referential Examples 2 and 3 in the above process.

EXAMPLE 2

This example is described with reference to FIG. 2A–FIG. 2D.

Figure 2A:
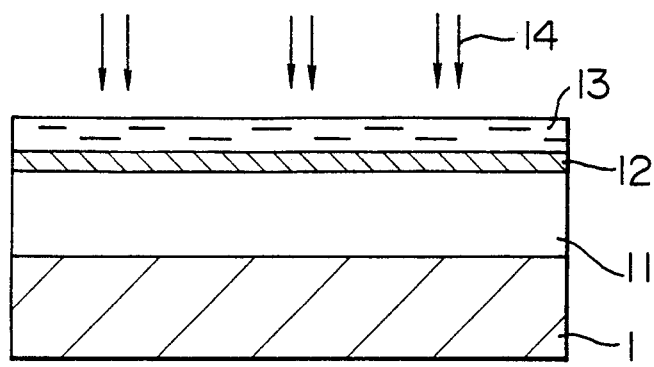

A film of poly-m-phenylene sulfide used in Referential Example 2 was formed as a bottom layer 11 on a semiconductor substrate 1 and baked at 250° C. for 20 minutes to obtain an organic polymer film having a thickness of 2 μm. On this organic polymer film was applied SOG to a thickness of 0.2 μm and the coating was baked at 200° C. for 20 minutes to form an intermediate layer 12, and then polymethyl methacrylate (PMMA) was applied thereon to a thickness of 0.5 μm and baked at 170° C. for 30 minutes to form an electron beam resist 13 (FIG. 2A).

Figure 2B:
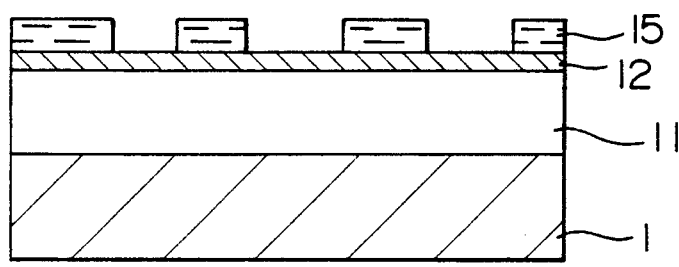
Figure 2C:
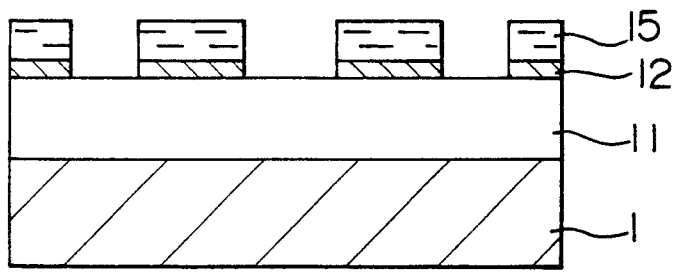

The resist film was exposed to electron beams 14 at an accelerating voltage of 20 kV and a dose of 100 μC/cm² and developed with a mixed solution of MIBK and IPA, thereby forming an accurate and fine resist pattern 15 free of field butting error due to charging (FIG. 2B).

Figure 2D:
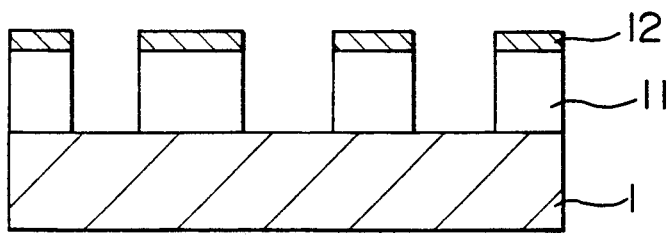

Using this resist pattern as a mask, dry etching of the SOG layer 12 was carried out (FIG. 2C), followed by etching of the organic polymer film by using the remaining SOG as a mask, whereby there could be obtained an accurate and fine vertical resist pattern (FIG. 2D). A similar result could be obtained when using the polymers obtained in Referential Examples 1 and 3 as the material forming the bottom layer in the above process.

EXAMPLE 3

This example is described by referring to FIG. 3A–FIG. 3D.

Figure 3A:
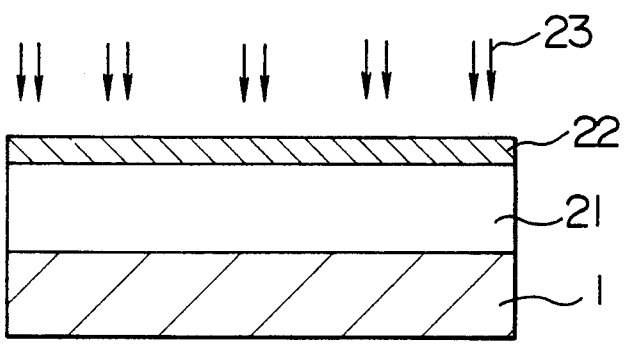
Figure 3B:
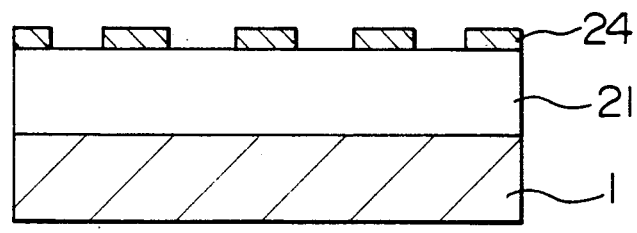
Figure 3C:
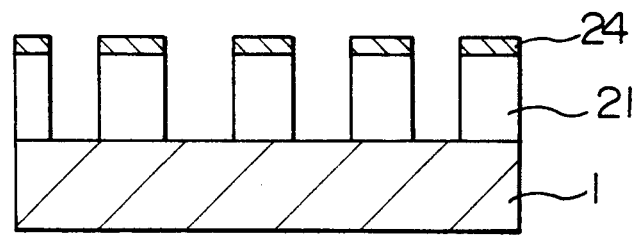

A film of poly-p-phenylene sulfide used in Referential Example 1 was applied on a semiconductor substrate 1 and baked at 250° C. for 20 minutes to form a 2 μm thick organic polymer film (bottom layer 21). Then a silicon-containing resist was applied on said organic polymer film and baked at 120° C. for 20 minutes to form a film of an electron beam resist 22 having a thickness of 0.3 μm (FIG. 3A). This resist film was exposed to electron beams 23 at an accelerating voltage of 20 kV and a dose of 20 μC/cm² and developed with IPA, thereby forming an accurate and fine resist pattern 24 (FIG. 3B). Then, by using this resist pattern as a mask, etching of the bottom layer 21 was carried out, forming a correct and vertical resist pattern (FIG. 3C). Thus, by using a two-layer resist, there could be obtained an accurate and fine resist pattern free of shift of pattern due to charging.

EXAMPLE 4

This example is illustrated with reference to FIG. 4.

Figure 4A:
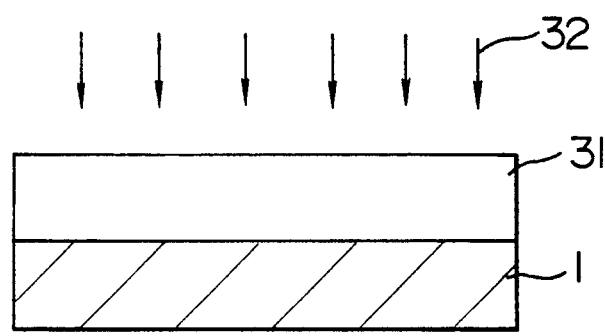
Figure 4B:
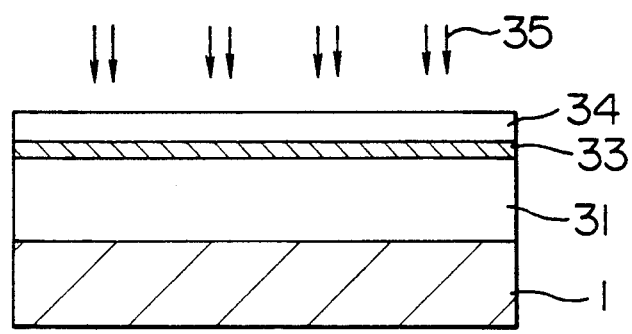
Figure 4C:
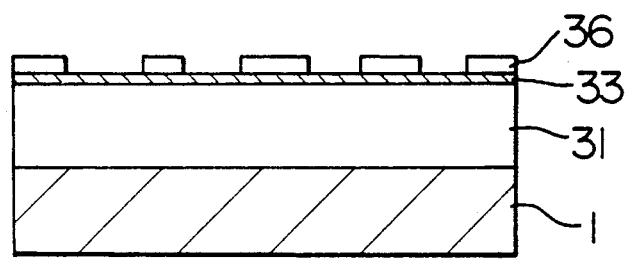
Figure 4D:
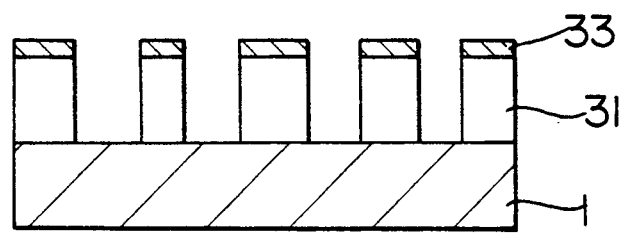

PPSO used in Referential Example 3 was coated on a semiconductor substrate 1 to a thickness of 2 μm and baked at 220° C. for 20 minutes to form a film constituting a bottom layer 31, and this film was doped with iodine ions 32 (FIG. 4A). On this film was applied SOG to a thickness of 0.2 μm, followed by baking of the coating at 200° C. for 20 minutes to constitute an intermediate layer 33, and then PMMA was further applied thereon to a thickness of 0.5 μm and baked at 170° C. for 30 minutes to form a film of an electron beam resist 34 (FIG. 4B). This resist film was irradiated with electron beams 35 at an accelerating voltage of 20 kV and a dose of 100 μC/cm² and developed with a mixed solution of MIBK and IPA to form an accurate and fine resist pattern 36 free of field butting error due to charging (FIG. 4C). By using this resist pattern as a mask, etching was carried out on the SOG film and then further on the bottom layer, whereby there could be obtained an accurate and vertical fine resist pattern (FIG. 4D). A similar result could be obtained when using ions of other elements than the iodine, such as arsenic, for doping while using the polymers used in Referential Examples 1 and 2 as the material for forming the bottom layer.

What is claimed is:

1. A method of forming a fine pattern comprising the steps of forming on a semiconductor substrate an organic polymer film and heat treating it, forming on the organic polymer film an inorganic film and heat treating it, forming on the inorganic film an electron beam resist film and heat treating it, drawing a pattern on the resist film, developing it to form a resist pattern, and etching the inorganic film and the organic polymer film using the resist pattern as a mask, wherein the improvement comprises using one conducting polymer selected from the group consisting of (A) homopolymers of polyphenylene sulfide and its derivatives, including poly-p-phenylene sulfides and derivatives thereof represented by formula (II);

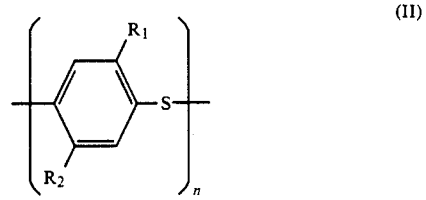

(II)

and poly-m-phenylene sulfides and derivatives thereof represented by formula (III),

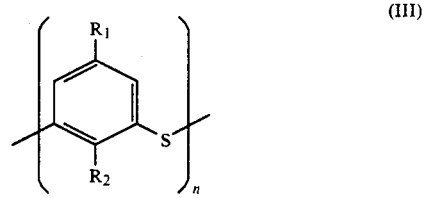

(III)

and (B) polymers represented by the formula (I):

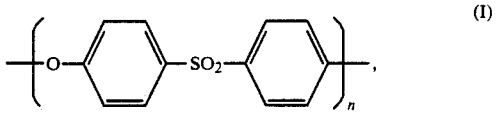

(I)

where $R_1$ and $R_2$ independently represent hydrogen or an alkyl group, and n is a positive integer, as at least one of the organic polymer film and the electron beam resist film.

2. A method of forming a fine pattern according to claim 1, wherein the at least one of the organic polymer film and the electron beam resist film is composed of polyphenylene sulfide or a derivative thereof.

3. A method of forming a fine pattern according to claim 2, wherein the polyphenylene sulfide or the derivative thereof is poly-p-phenylene sulfide or a derivative thereof represented by the formula (II):

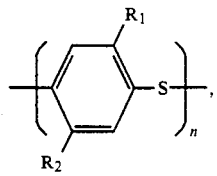

where $R_1$ and $R_2$ independently represent hydrogen or an alkyl group, and n is a positive integer.

4. A method of forming a fine pattern according to claim 2, wherein the polyphenylene sulfide or the derivative thereof is poly-m-phenylene sulfide or a derivative thereof represented by the formula (III):

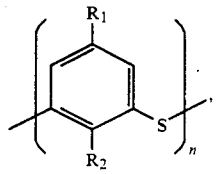

where $R_1$ and $R_2$ independently represent hydrogen or an alkyl group, and n is a positive integer.

5. A method of forming a fine pattern according to claim 3, wherein the electron beam resist film is composed of poly-p-phenylene sulfide or a derivative thereof.

6. A method of forming a fine pattern according to claim 4, wherein the electron beam resist film is composed of poly-m-phenylene sulfide or a derivative thereof.

7. A method of forming a fine pattern according to claim 1, wherein the electron beam resist film is composed of a polymer represented by the formula (I).

8. A method of forming a fine pattern according to claim 4, wherein the organic polymer film is composed of a polyphenylene sulfide or a derivative thereof.

9. A method of forming a fine pattern according to claim 1, wherein the organic polymer film is composed of a polymer represented by the formula (I).

10. A method of forming a fine pattern according to claim 1, wherein the organic polymer film is composed of a polyphenylene sulfide, a derivative thereof or a polymer represented by the formula (I), and it is doped with ions after a heat treatment.

11. A method of forming a fine pattern according to claim 1, wherein the electron beam resist film is composed of a polyphenylene sulfide, a derivative thereof or a polymer represented by the formula (I), and it is doped with ions after a heat treatment.

* * * * *